United States Patent
Bhargava et al.

(10) Patent No.: US 10,352,971 B2
(45) Date of Patent: Jul. 16, 2019

(54) VOLTAGE DETECTION WITH CORRELATED ELECTRON SWITCH

(71) Applicant: ARM Ltd., Cambridge (GB)

(72) Inventors: Mudit Bhargava, Austin, TX (US); Glen Arnold Rosendale, San Jose, CA (US); Shidhartha Das, Cambridge (GB)

(73) Assignee: ARM Ltd., Cambridge (GB)

( * ) Notice: Subject to any disclaimer, the term of this patent is extended or adjusted under 35 U.S.C. 154(b) by 382 days.

(21) Appl. No.: 15/282,973

(22) Filed: Sep. 30, 2016

(65) Prior Publication Data

US 2018/0095114 A1  Apr. 5, 2018

(51) Int. Cl.
*G01R 19/165* (2006.01)
*G01R 27/02* (2006.01)
*G11C 13/00* (2006.01)
*H01L 45/00* (2006.01)
*H03K 19/00* (2006.01)

(52) U.S. Cl.
CPC .......... *G01R 19/165* (2013.01); *G01R 27/02* (2013.01); *G11C 13/0002* (2013.01); *G11C 13/004* (2013.01); *H01L 45/04* (2013.01); *H01L 45/1233* (2013.01); *H01L 45/146* (2013.01); *H03K 19/0005* (2013.01)

(58) Field of Classification Search
CPC .. G01R 19/165; G01R 27/02; G11C 13/0002; G11C 13/004; H01L 45/04; H01L 45/1233
USPC ............ 365/46, 94, 100, 129, 148, 158, 163
See application file for complete search history.

(56) References Cited

U.S. PATENT DOCUMENTS

| | | |
|---|---|---|
| 7,298,640 B2 | 11/2007 | Chen et al. |
| 7,639,523 B2 | 12/2009 | Celinska et al. |
| 7,778,063 B2 | 8/2010 | Brubaker et al. |
| 7,872,900 B2 | 1/2011 | Paz de Araujo et al. |
| 9,558,819 B1 | 1/2017 | Aitken et al. |
| 9,584,118 B1 | 2/2017 | Dao et al. |
| 9,589,636 B1 | 3/2017 | Bhavnagarwala et al. |
| 9,627,615 B1 | 4/2017 | Reid et al. |
| 2003/0053350 A1* | 3/2003 | Krieger .................. B82Y 10/00 365/200 |
| 2003/0179633 A1* | 9/2003 | Krieger .................. B82Y 10/00 365/200 |
| 2005/0135151 A1* | 6/2005 | Hannah ................... G11C 11/16 365/173 |
| 2008/0106926 A1 | 5/2008 | Brubaker |
| 2008/0107801 A1 | 5/2008 | Celinska et al. |
| 2011/0128773 A1 | 6/2011 | Azuma |
| 2013/0200323 A1 | 8/2013 | Pham et al. |

(Continued)

FOREIGN PATENT DOCUMENTS

WO      2008/058264 A2    5/2008

OTHER PUBLICATIONS

App PCT/GB2017/052883 / : International Search Report and Written Opinion, dated Jan. 4, 2018, 13 pages.

(Continued)

*Primary Examiner* — Harry W Byrne
(74) *Attorney, Agent, or Firm* — Berkeley Law & Technology Group, LLP

(57) ABSTRACT

Subject matter disclosed herein may relate to correlated electron switch devices, and may relate more particularly to voltage detection with correlated electron switch devices.

19 Claims, 8 Drawing Sheets

(56) References Cited

U.S. PATENT DOCUMENTS

| | | |
|---|---|---|
| 2013/0214232 A1 | 8/2013 | Tendulkar et al. |
| 2013/0285699 A1 | 10/2013 | McWilliams et al. |
| 2013/0343117 A1* | 12/2013 | Lua .................... G11C 11/1675 |
| | | 365/158 |
| 2016/0005461 A1 | 1/2016 | Jo |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

OTHER PUBLICATIONS

Notification Concerning Transmittal of International Preliminary Report on Patentability (Chapter 1 of the Patent Cooperation Treaty), dated Apr. 11, 2019, International Application No. PCT/GB2017/052883, 1 pg.

International Preliminary Report on Patentability (Chapter 1 of the Patent Cooperation Treaty), dated Apr. 11, 2019, International Application No. PCT/GB2017/052883, 9 pgs.

* cited by examiner

VOLTAGE DETECTION WITH CORRELATED ELECTRON SWITCH

BACKGROUND

Field

Subject matter disclosed herein may relate to correlated electron switch devices, and may relate more particularly to voltage detection with correlated electron switch devices.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory devices, logic devices, and/or other device or circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory device, logic devices, and/or other device or circuit types that exhibit characteristics of lower power, lower cost, and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
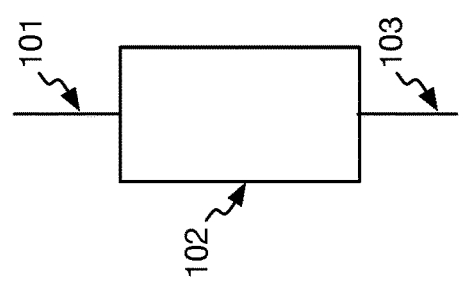
FIG. 1b depicts an illustration of an example symbol for a correlated electron switch device, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe example embodiments utilizing electron materials (CEMs) in correlated electron switch (CES) devices, for example, such as may be utilized to form a correlated electron random access memory (CERAM) in memory and/or logic devices, and/or such as may be utilized in any number of other circuit and/or device types, for example. Correlated electron materials, which may be utilized in the construction of CERAM devices and CES devices, for example, may also be utilized in a wide range of other electronic circuit types, such as, for example, memory controllers, memory arrays, processors, microcontrollers, filter circuits, data converters, optical instruments, phase locked loop circuits, microwave and millimeter wave transceivers, and so forth, although claimed subject matter is not limited in scope in these respects. In this context, a CES device may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CES device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3}$ $a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CES device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, transitioning from a relatively insulative/higher impedance state to a substantially dissimilar and relatively conductive/lower impedance state may bring about a change in capacitance in addition to a change in resistance. For example, a CEM may exhibit a variable resistance together with a property of variable capacitance. In other words, impedance characteristics of a CEM may include both resistive and capacitive components. For example, in a metal state, a CEM may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

Figure 1A:
FIG. 1a shows block diagram of an example embodiment of a correlated electron switch device comprising a correlated electron material, in accordance with an embodiment.

FIG. 1a shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
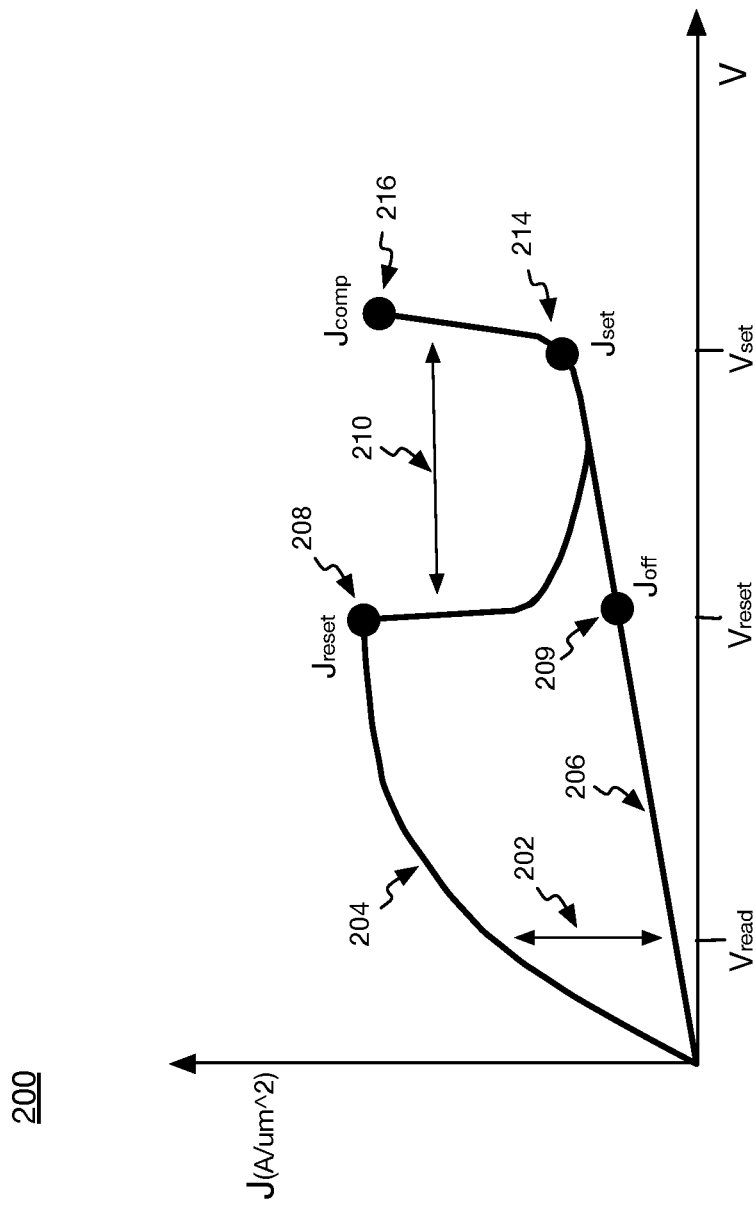
FIG. 2 shows an example plot of current density versus voltage for a correlated electron switch device, in according to an embodiment.

FIG. 2 is a diagram showing an example voltage versus current density profile of a device formed from a CEM according to an embodiment 200. Based, at least in part, on a voltage applied to terminals of a CEM device, for example, during a "write operation," a CEM device may be placed into a relatively low-impedance state or a relatively high-impedance state. For example, application of a voltage $V_{set}$ and a current density $J_{set}$ may place a CEM device into a relatively low-impedance memory state. Conversely, application of a voltage $V_{reset}$ and a current density $J_{reset}$ may place a CEM device into a relatively high-impedance memory state. As shown in FIG. 2, reference designator 210 illustrates the voltage range that may separate $V_{set}$ from $V_{reset}$. Following placement of a CEM device into an high-impedance state or low-impedance state, the particular state of a CEM device may be detected by application of a voltage $V_{read}$ (e.g., during a read operation) and detection of a current or current density at terminals of a CEM device.

According to an embodiment, a CEM device of FIG. 2 may include any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CEM device. Other implementations may employ other transition metal compounds without deviating from claimed subject matter.

In one aspect, a CEM device of FIG. 2 may comprise materials of the general form $AB:L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$, which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as $NiO:L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dO_f$ (in which a≥1, and b, d and f≥0) such as: carbonyl (CO), cyano (CN⁻), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$)), pyridine ($C_5H_5N$), acetonitrile ($CH_3CN$), and cyanosulfanides such as thiocyanate (NCS⁻), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a substantially dissimilar impedance state, such as a relatively high-impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively high-impedance material. If a CEM device comprises a relatively high-impedance state, current may generated by transportation of electron holes. Consequently, if a threshold voltage is applied across terminals of a CEM device, electrons may be injected into a metal-insulator-metal (MIM) diode over the potential barrier of the MIM device. If a threshold current of electrons is injected and a threshold potential is applied across terminals to place a CEM device into a "set" state, an increase in electrons may screen electrons and remove a localization of electrons, which may operate to collapse the band-splitting potential, thereby bringing about a relatively low-impedance state.

According to an embodiment, current in a CEM device may be controlled by an externally applied "compliance" condition, which may be determined at least partially on the basis of an applied external current, which may be limited during a write operation, for example, to place a CEM device into a relatively high-impedance state. This externally-applied compliance current may, in some embodiments, also set a condition of a current density for a subsequent reset operation to place a CEM device into a relatively high-impedance state. As shown in the particular implementation of FIG. 2, a current density $J_{comp}$ may be applied during a write operation at point 116 to place a CEM device into a relatively high-impedance state, may determine a compliance condition for placing a CEM device into a low-impedance state in a subsequent write operation. As shown in FIG. 2, a CEM device may be subsequently placed into a low-impedance state by application of a current density $J_{reset} \geq J_{comp}$ at a voltage $V_{reset}$ at point 208, at which $J_{comp}$ is externally applied.

In embodiments, compliance may set a number of electrons in a CEM device which may be "captured" by holes for the Mott transition. In other words, a current applied in a write operation to place a CEM device into a relatively low-impedance memory state may determine a number of holes to be injected to a CEM device for subsequently transitioning a CEM device to a relatively high-impedance memory state.

As pointed out above, a reset condition may occur in response to a Mott transition at point 208. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

In which $A_{CEM}$ is a cross-sectional area of a CEM device; and $J_{reset}(V_{MI})$ may represent a current density through a CEM device to be applied to a CEM device at a threshold voltage $V_{MI}$, which may place a CEM device in a relatively high-impedance state.

Figure 3:
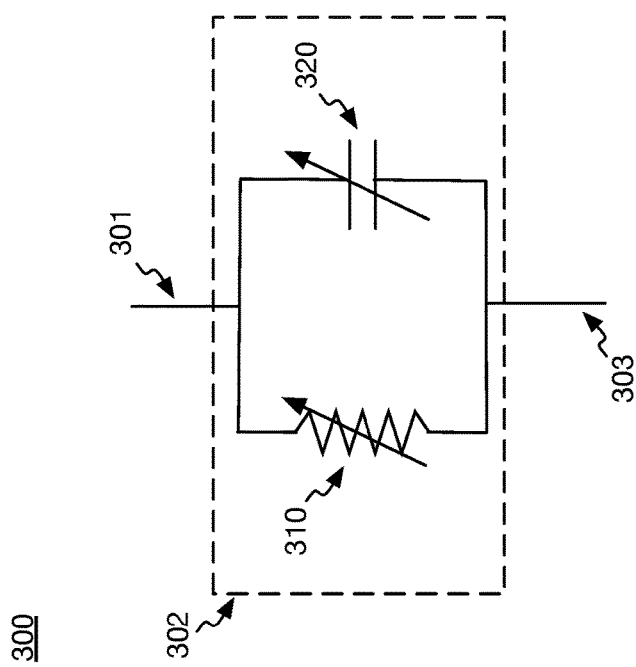
FIG. 3 is a schematic diagram of an equivalent circuit of a correlated electron switch, in accordance with an embodiment.

FIG. 3 depicts a schematic diagram of an equivalent circuit of an example CEM switch device according to an embodiment 300. As previously mentioned, a correlated electron device, such as a CEM switch, a CERAM array, or other type of device utilizing one or more correlated electron materials may comprise variable or complex impedance device that may exhibit characteristics of both variable resistance and variable capacitance. In other words, impedance characteristics for a CEM variable impedance device, such as the device according to embodiment 300, may depend at least in part on resistance and capacitance characteristics of the device if measured across device terminals 301 and 302, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the device of embodiment 300.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 300, may transition between a low-impedance state and a substantially dissimilar high-impedance state as a function at least partially dependent on a voltage applied across a CEM device. In an embodiment, an impedance exhibited at a low-impedance state may be approximately in the range of 10.0-100,000.0 times lower than a substantially dissimilar impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Truth Table 1 shows that a capacitance of a variable impedance device, such as the device of embodiment 300, may transition between a relatively lower capacitance state, which, in an example embodiment, may comprise approximately zero, or very little, capacitance, and a relatively higher capacitance state that is a function, at least in part, of a voltage applied across a CEM device.

According to an embodiment, a CEM device, which may be utilized to form a CEM switch, a CERAM memory device, and/or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of a CEM device overcomes a threshold switching potential (e.g., $V_{set}$), injected electrons may begin to screen. As previously mentioned, screening may operate to un-localize double-occupied electrons to collapse the band-splitting potential, thereby bringing about a relatively low-impedance state.

As mentioned, integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory devices, logic devices, and/or other device or circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory device, logic devices, and/or other device or circuit types that exhibit characteristics of lower power, lower cost, and/or higher speed.

In an embodiment, it may be desirable and/or advantageous to detect voltage level spikes and/or droops on a voltage signal. For example, it may be advantageous for signal integrity, security, and/or reliability purposes to understand whether a supply voltage line for an electronic device, such as a cellular phone, for example, has exceeded a specified threshold level, and/or has fallen below a specified threshold level at some point. Such voltage level detection operations may be advantageous to detect attempts to tamper with an electronic device and/or to detect out-of-specification operation of an electronic device. For example, it may be advantageous to detect whether a "chip" card, such as a debit and/or credit card, for example, has been exposed to voltages exceeding a specified threshold, as may occur in the event of tampering, for example. Of course, these are merely example applications for voltage detection operations, and claimed subject matter is not limited in scope in these respects.

Figure 4:
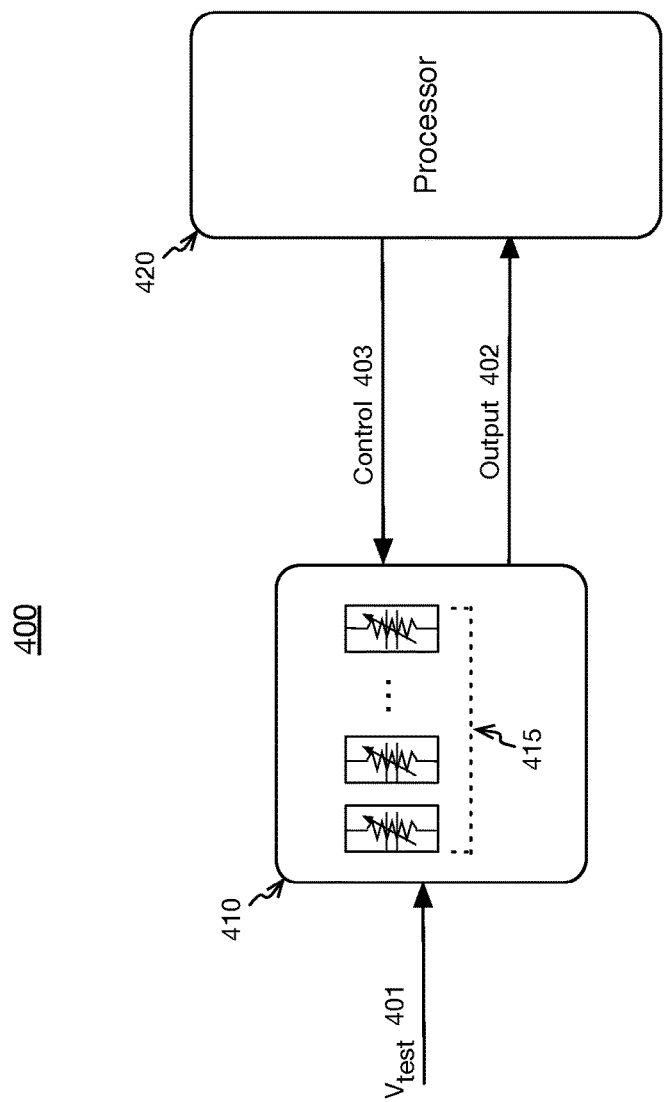
FIG. 4 depicts a schematic block diagram of an example circuit for detecting a magnitude of a deviation of a voltage signal level from a specified voltage threshold level, in accordance with an embodiment.

FIG. 4 depicts a schematic block diagram of an embodiment 400 of an example system, including example detection circuit 410, for detecting a change in voltage level, and more particularly an example circuit for detecting a magnitude of a deviation of a voltage signal level from a specified voltage threshold level. In an embodiment, a voltage signal, such as $V_{test}$ 401, may be applied to an example voltage detection circuit, such as circuit 410. In an embodiment, a voltage signal, such as $V_{test}$ 401, may comprise a voltage signal to be observed for voltage variations beyond a specified threshold and/or range. In an embodiment, a voltage detection circuit, such as 410, may include one or more CES devices, such as CES devices 415, to detect and/or store one or more signals and/or states indicating a deviation of a voltage level, such as for voltage signal $V_{test}$ 401, from a specified voltage level.

For example, in an embodiment, a threshold of 1 V may be specified for a voltage signal, such as $V_{test}$ 401. At least in part in response to a voltage signal, such as $V_{test}$ 401, exceeding the threshold level, one or more CES devices, such as one or more of CES devices 415, may transition from a first impedance state to a second impedance state depending at least in part on the magnitude of the voltage signal, in an embodiment. For example, a small deviation of the voltage signal level may result in a single CES device, such as one of CES devices 415, transitioning to a second impedance state. A larger deviation of the voltage signal may result in multiple CES devices, such as a plurality of CES devices 415, transitioning to the second impedance state, for example. Also, in an embodiment, the impedance states of individual CES devices, such as CES devices 415, may affect a voltage level observed at an output of a detection circuit, such as output signal 402.

In an embodiment, a read operation may be performed by a circuit and/or device, such as processor 420, to determine the various states of the various CES devices, such as CES devices 415, and to thereby detect the magnitude of the deviation of the voltage signal level from the specified level. For example, one or more control signals, such as 403, may be communicated between a processor, such as processor 420, and a voltage detection circuit, such as 410. Further, in an embodiment, at least in part in response to a communication of one or more control signals, an output voltage signal, such as 402, may be communicated between a voltage detection circuit, such as 410, and a processor, such as 420. As explained more fully below, control signals, such as 403, may include, for example, a read voltage signal, a test enable signal, and/or a reset signal, in an embodiment. Thus, in an embodiment, CES devices, such as CES devices 415, may detect a voltage level deviation and/or may further store one or more signals and/or states indicating the magnitude of a voltage level deviation, as explained more fully below.

In an embodiment, voltage level deviation, such as voltage level spikes and/or droops, may be detected for any type of voltage-based signals, including, for example, supply voltage signals, clock signals, content transmission signals, etc., and/or for any type of electronic device, including, for example, cellular phones, mobile devices, computing devices, etc., although claimed subject matter is not limited in scope in these respects.

Figure 5:
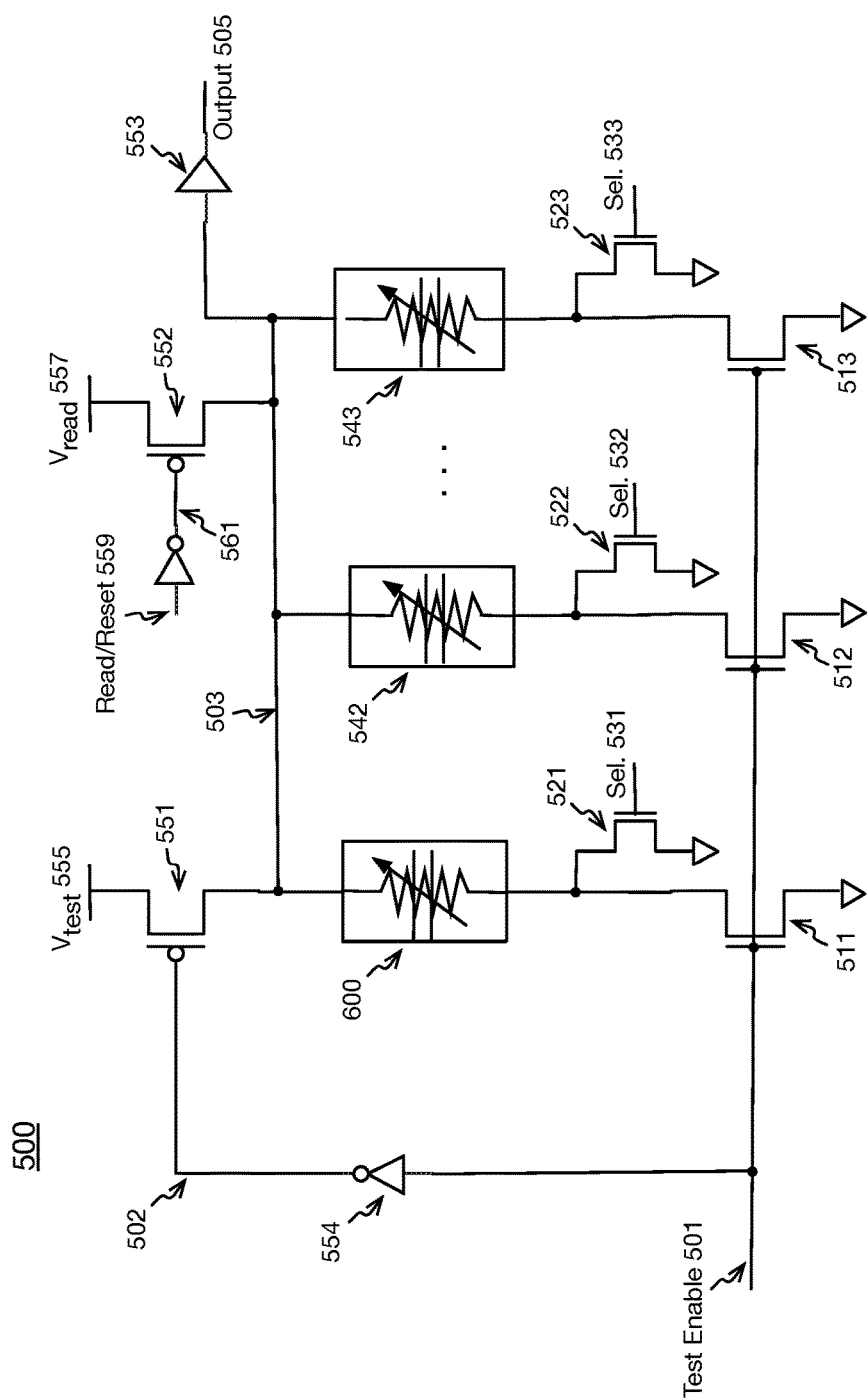
FIG. 5 depicts a schematic block diagram of an example circuit, including one or more example correlated electron switch devices, for detecting a magnitude of a deviation of a voltage signal level from a specified voltage threshold level, in accordance with an embodiment.

FIG. 5 depicts a schematic block diagram of an embodiment 500 of an example voltage level deviation detection circuit. In an embodiment, a voltage level deviation detection circuit, such as 500, may include one or more example CES devices, such as 600, 542, and/or 543, to detect a magnitude of a deviation of a voltage signal level from a specified voltage threshold level. For example, an example detection circuit, such as 500, may detect a deviation in voltage level, such as a spike in voltage level for a voltage signal, such as $V_{test}$ 555.

In an embodiment, CES devices, such as CES devices 600, 542, and 543, may be initially programmed to a relatively higher impedance state. Also, in an embodiment a reset operation may be utilized to program CES devices, such as CES devices 600, 542, and 543, to a relatively higher impedance state. For example, read/reset signal 559 may be asserted, thereby enabling current to flow through an electronic switch, such as transistor 552. A voltage signal, such as 555, may be applied to a node, such as node 503, in an embodiment. Also, in conjunction with one or more select signals, such as select signals 531, 532, and/or 533 and/or one or more electronic switches 521, 522, and 523, an appropriate voltage applied to node 503 by way of electronic switch device 552 may cause a transition in impedance state from a relatively lower impedance state to a relatively higher impedance state for one or more of CES devices 600, 542, and/or 543. In an embodiment, individual CES devices may be selected for reset depending, at least in part, on assertion of an individual select signal, such as one of 531, 532, and/or 533. Further, in an embodiment, a test enable signal, such as 501, may be de-asserted during reset operations.

At least in part in response to a reset operation, whereby CES devices, such as CES devices 600, 542, and/or 543, may be programmed to a relatively higher impedance state, voltage signal deviation detection operations may begin by de-asserting read/reset signal 559, and/or by asserting test enable signal 501, in an embodiment. Additionally, for voltage signal deviation detection operations, select signals, such as 531, 532, and 533 may also be de-asserted. For example, in embodiment 500, electronic switches, such as NMOS transistors 521, 522, and 523, may be enabled at least in part in response to select signals, such as select signals 531, 532, and/or 533, being driven to a logically high voltage level. Similarly, electronic switches, such as NMOS transistors 521, 522, and 523, may be disabled at least in part in response to select signals, such as select signals 531, 532, and/or 533, being driven to a logically low voltage level.

As utilized herein, the term "asserted" refers to a voltage signal being driven to a logically high voltage level in the case an active-high signal, such as select signal 531 for NMOS transistor 521, and/or being driven to a logically low voltage level in the case of an active-low signal, such as 561 for PMOS transistor 552. Further, as utilize herein, the term "de-asserted" refers to a voltage signal being driven to a logically low voltage level in the case of an active-high signal, such as select signal 531 for NMOS transistor 521, and/or being driven to a logically high voltage level in the case of an active-low signal, such as 561 for PMOS transistor 552.

In an embodiment, during voltage level deviation detection operations, a voltage signal, such as $V_{test}$ 555, may be applied to a node, such as 503, electrically coupled to CES devices, such as CES devices 600, 542, and/or 543. In an embodiment, test enable signal 501 may be asserted, thereby enabling an electronic switch, such as PMOS transistor 551, to electrically couple a voltage signal, such as $V_{test}$ 555, to node 503 and CES devices 600, 542, and 543. Also, during voltage level deviation detection operations, test enable signal 501 may enable NMOS transistors 511, 512, and/or 513, thereby providing an electrically conductive path between CES devices 600, 542, and/or 543, and a ground reference level, as depicted in example embodiment 500.

Also, in an embodiment, each of CES devices 600, 542, and/or 543 may comprise set voltage thresholds that differ one from another. For example, a set voltage threshold (the voltage level at which a "set" condition occurs causing a transition from a relatively higher impedance state to a relatively lower impedance state in a CES device) for CES device 600 may be 0.9V, a set voltage threshold for CES device 542 may comprise 1.0V, and/or a set voltage threshold for CES device 543 may comprise 1.1V, for example. Of course, claimed subject matter is not limited in scope to these specific example voltages and/or thresholds. Also, though three CES devices are depicted in example embodiment 500, claimed subject matter is not so restricted, and other embodiments in accordance with claimed subject matter may utilize other amounts of CES devices.

In an embodiment, if a voltage signal, such as $V_{test}$ 555, exceeds a set voltage threshold level for one or more CES devices, such as one or more of CES devices 600, 542, and/or 543, the impedance state of the one or more CES devices may transition from a relatively higher impedance state to a relatively lower impedance state. In an embodiment, the various states of the respective CES devices may be indicative of a magnitude of a deviation of a voltage level with respect to a specified voltage threshold level. For the example of FIG. 5, if $V_{test}$ 555, for example, reaches a voltage level of 1.0V at some point during detection operations, CES device 600, with its set voltage level of 0.9V, and CES device 542, with its set voltage level of 1.0V, may both transition to a relatively lower voltage level in response to the application of $V_{test}$ 555. CES device 543, in this example, may retain a relatively higher impedance state with its set voltage of 1.1V. Again, claimed subject matter is not limited in scope to the specific examples described herein.

To obtain results of a detection operation, test enable signal 501 may be de-asserted, and read/reset signal 559 may be asserted, in an embodiment. An assertion of read/reset signal 559 may electrically couple a read voltage, such as $V_{read}$ 557, to node 503, for example, to provide a read voltage level, such as 0.3V, for example, for CES devices 600, 542, and/or 543. In an embodiment, CES devices, such as 600, 542, and/or 543, may be individually selected for a read operation at least in part by individually asserting select signals 531, 532, and/or 533. For example, to detect an impedance state of CES device 600, select signal 531 may be asserted, thereby electrically coupling CES device 600 to a ground reference level, and also thereby allowing current to flow through CES device 600 from node 503 to ground, in an embodiment. In an embodiment, results of such a read operation may be provided as an output signal, such as 503, which may be driven by an amplifier, such as 553, for example. Similarly, read operations for CES devices 542 and 543 may be performed at least in part by sequentially and/or individually asserting respective select signals 532 and 533, in an embodiment.

For embodiment 500, for example, at least in response to a read operation, CES devices 600, 542, and/or 543 may again be reset to a relatively high impedance state, and example circuit 500 may again be prepared for additional voltage level deviation detection operations. Also, in an embodiment, a range of voltages to be tested for spikes and/or droops, for example, may be altered and/or extended at least in part by processing a voltage signal to be tested with a voltage divider and/or with an amplifier, such as an opamp, for example. By designing different circuits with different voltage dividers and/or amplifiers to be utilized in conjunction with a voltage signal, such as $V_{test}$ 555, a wider range of voltage signals may be observed for spikes and/or droops, in an embodiment.

Figure 6:
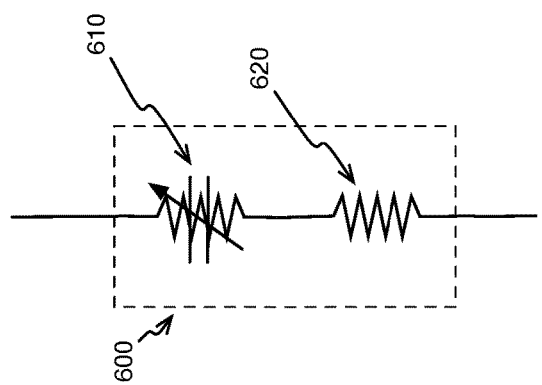
FIG. 6 is a schematic diagram depicting an example correlated electron switch device, in accordance with an embodiment.

FIG. 6 is a schematic diagram depicting an embodiment 600 of a CES device. For embodiment 600, the CES device may be similar in at least some respects to one or more of CES devices 600, 542, and/or 543 depicted in FIG. 5. As mentioned, individual CES devices in a detection circuit, such as example embodiment 500, may comprise individual set voltage threshold levels. In an embodiment, different set voltage threshold levels for CES devices, such as CES devices 600, 542, and/or 543, may be achieved at least in part via design and/or manufacturing techniques and/or by way of the use of different CEM for the various CES devices. In another embodiment, different set voltage threshold values may be achieved at least in part by positioning a resistive component, such as resistor 620, in series with a CES, such as CES 610. In an embodiment, a resistive component, such as resistor 620, may result in a voltage drop across the resistive component during voltage deviation detection operations, thereby effectively altering the voltage needed to be applied across CES device, such as CES device 600, before CES 610 may transition to a relatively lower impedance state. In an embodiment, by manipulating resistance values for different resistive components, such as resistor 620, different set voltage threshold levels may be achieved.

Figure 7:
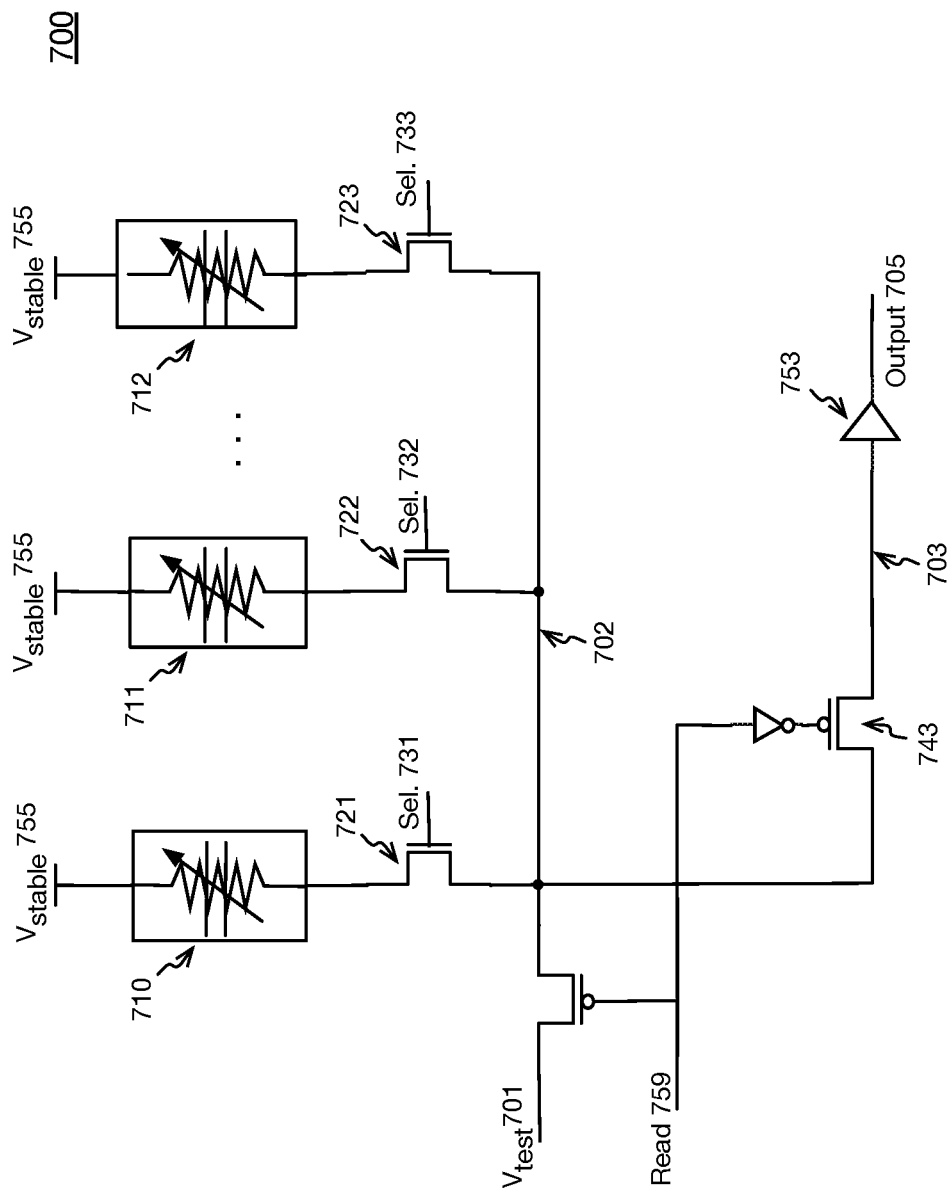
FIG. 7 depicts a schematic block diagram of an example circuit, including one or more example correlated electron switch devices, for detecting a magnitude of a deviation of a voltage signal level from a specified voltage threshold level, in accordance with an embodiment.

FIG. 7 depicts a schematic block diagram of an embodiment 700 of an example circuit for detecting a magnitude of a deviation of a voltage signal level from a specified voltage threshold level. As seen above for embodiment 500 depicted in FIG. 5, voltage spikes may be detected for a voltage signal using one or more CES devices. For example embodiment 700, voltage droops may be detected utilizing one or more CES devices, such as CES devices 710, 711, and/or 712. Of course, although three CES devices are described for this example embodiment, other embodiments may make use of any number of CES devices, and claimed subject matter is not limited in scope in this respect.

In an embodiment, CES devices, such as CES devices 710, 711, and/or 712 may be initially programmed to a relatively lower impedance state. Also, in an embodiment, a relatively stable voltage, such as $V_{stable}$ 755, may be provided to respective first nodes of CES devices 710, 711, and/or 712. In an embodiment, $V_{stable}$ 755 may comprise a lower current voltage source. To enable detection operations, select signals 731, 732, and 733 may be asserted to enable electronic switches 721, 722, and 723, thereby electrically coupling node 702 to respective second nodes of CES devices 710, 711, and 712, in an embodiment. In an embodiment, a read signal 759 may be de-asserted, thereby electrically coupling a voltage signal, such as $V_{test}$ 701, to node 702, for example.

Further, in an embodiment, if $V_{test}$ 701 on node 702, for example, falls below a threshold value, one or more of CES devices 710, 711, and/or 712 may transition from a relatively lower impedance state to a relatively higher impedance state. As with example embodiment 500 above, the individual CES devices to transition impedance states may depend at least in part on a magnitude of a deviation of a voltage signal, such as $V_{test}$ 701, from a specified threshold value. For example, if $V_{test}$ 701 falls in level more than a reset voltage threshold level below a level for $V_{stable}$ 755 for one or more of CES devices 710, 711, and/or 712, one or more of CES devices 710, 711, and/or 712 may transition to a relatively higher impedance state. As with other embodiments described herein, CES devices 710, 711, and/or 712 may have different set and/or reset threshold values based at least in part on resistive components, such as discussed above in connection with embodiment 600, for example, and/or on CES device design and/or manufacturing characteristics, in an embodiment.

Further, in an embodiment, CES devices 710, 711, and/or 712 may be read individually and/or sequentially, for example, to determine which CES devices transitioned to the higher impedance state, and thereby to determine a magnitude of a deviation of a voltage signal level from a specified voltage threshold level. For example, a read signal, such as 759, may be asserted to electrically couple node 702 to node 703, and to output 705 through an amplifier, such as 753, in an embodiment. Of course, claimed subject matter is not limited in scope to the specific example circuits and techniques provided herein.

For another embodiment, a variation of example embodiment 700 may comprise CES devices initially programmed to a relatively higher impedance state. Also, if $V_{test}$ 701 falls in level more than a set voltage threshold level below a level for $V_{stable}$ 755 for one or more of CES devices 710, 711, and/or 712, one or more of CES devices 710, 711, and/or 712 may transition to a relatively lower impedance state.

Figure 8:
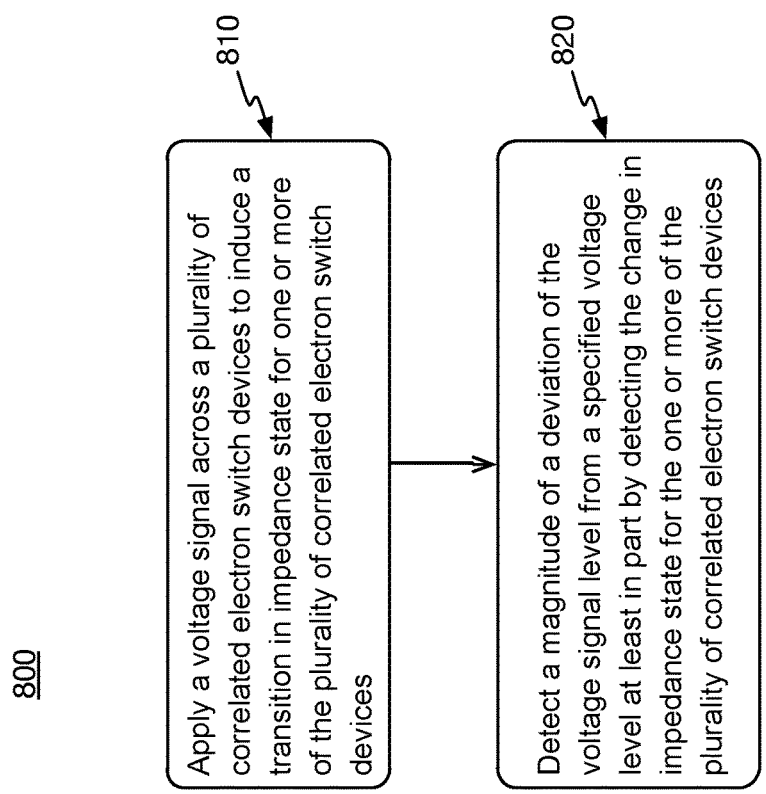
FIG. 8 depicts a simplified flowchart for an example process for detecting a magnitude of a deviation of a voltage signal level from a specified voltage threshold level, in accordance with an embodiment.

FIG. 8 depicts a simplified flowchart for an embodiment 800 of an example process for detecting a magnitude of a deviation of a voltage signal level from a specified voltage threshold level. Claimed subject matter may include all of blocks 810-820, fewer than blocks 810-820, or more than blocks 810-820. Also, the order of blocks 810-820 is merely an example order, and claimed subject matter is not limited in scope in this respect.

At block 810, a voltage signal may be applied across a plurality of CES devices to induce a transition in impedance state for one or more of the plurality of CES devices. Further, at block 820, a magnitude of a deviation of the voltage signal level from a specified voltage level may be detected at least in part by detecting the change in impedance state for the one or more of the plurality of CES devices. In this manner, deviations in voltage signal level from a specified threshold level may be detected and a magnitude of the deviation may be stored as one or more signals and/or states utilizing one or more CES devices, as explained above.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:
1. A method, comprising:
   detecting a magnitude of a deviation of a voltage signal level from a specified voltage level at least in part by detecting a transition in an impedance state for one or more correlated electron switch devices.

2. The method of claim 1, wherein the detecting the transition in the impedance state for the one or more correlated electron switch devices comprises detecting the transition in the impedance state for the one or more correlated electron switch devices of a plurality of correlated electron switch devices.

3. The method of claim 2, wherein the plurality of correlated electron switch devices individually comprise one or more correlated electron materials and one or more resistive materials.

4. The method of claim 2, wherein the one or more of the plurality of correlated electron switch devices individually comprise set voltage threshold levels different from at least one other correlated electron switch device of the plurality of correlated electron switch devices.

5. The method of claim 2, wherein the detecting the magnitude of the deviation of the voltage signal level from the specified voltage level comprises applying the voltage signal across the plurality of correlated electron switch devices to induce the transition in the impedance state for the one or more of the plurality of correlated electron switch devices.

6. The method of claim 5, wherein the applying the voltage signal across the plurality of correlated electron switch devices comprises applying the voltage signal at least in part in response to an assertion of a test enable signal.

7. The method of claim 6, wherein the detecting the transition in the impedance state for the one or more of the plurality of correlated electron switch devices comprises de-asserting the test enable signal, and wherein the method further comprises electrically coupling a read voltage signal to respective first nodes of the plurality of correlated electron switch devices at least in part in response to an assertion of a read signal.

8. The method of claim 7, wherein the detecting the transition in the impedance state for the one or more of the plurality of correlated electron switch devices comprises asserting a plurality of select signals to a respective plurality of electronic switch devices to enable current flow through the plurality of correlated electron switch devices.

9. The method of claim 8, wherein the asserting the plurality of select signals to the plurality of correlated electronic switch devices comprises sequentially asserting individual select signals of the plurality of select signals to sequentially enable current flow through individual correlated electron switch devices of the plurality of correlated electronic switch devices.

10. The method of claim 9, further comprising resetting the plurality of correlated electron switch devices at least in part by applying a reset voltage signal across the plurality of correlated electron devices.

11. An apparatus, comprising:
a plurality of correlated electron switch devices to detect a magnitude of a deviation of a level of a voltage signal from a specified voltage level, wherein one or more of the plurality of correlated electron switch devices to transition from a first impedance state to a second impedance state at least in part in response to application of the voltage signal across the plurality of correlated electron switch devices.

12. The apparatus of claim 11, wherein the first impedance state comprises a relatively higher impedance state and wherein the second impedance state comprises a relatively lower impedance state.

13. The apparatus of claim 11, wherein the plurality of correlated electron switch devices individually comprise one or more correlated electron materials and one or more resistive materials.

14. The apparatus of claim 13, wherein the one or more of the plurality of correlated electron switch devices individually comprise set voltage threshold levels different from at least one other correlated electron switch device of the plurality of correlated electron switch devices.

15. The apparatus of claim 14, wherein the voltage signal to be applied across the plurality of correlated electron switch devices at least in part in response to an assertion of a test enable signal to a first electronic switch device, the first electronic switch device to electrically couple the voltage signal to respective first nodes of the plurality of correlated electron devices.

16. The apparatus of claim 15, further comprising a second electronic switch device to electrically couple a read voltage signal to the respective first nodes of the plurality of correlated electron devices at least in part in response to an assertion of a read signal and at least in part in response to a de-assertion of the test enable signal.

17. The apparatus of claim 16, further comprising a plurality of third electronic switch devices to electrically couple respective second nodes of the plurality of correlated electron switch devices to a ground voltage level to enable current flow through the plurality of correlated electron switch devices at least in part in response to assertion of a respective plurality of select signals to the plurality of third electronic switch devices.

18. The apparatus of claim 17, wherein individual select signals of the plurality of select signals to be sequentially asserted to individual third electronic switches of the plurality of third electronic switches to sequentially enable current flow through individual correlated electron switch devices of the plurality of correlated electronic switch devices.

19. The apparatus of claim 18, wherein the plurality of correlated electron switch devices to be reset to the first impedance state at least in part in response to a reset voltage signal to be applied across the plurality of correlated electron devices.

* * * * *